(12) United States Patent
Kurosaka

(10) Patent No.: US 6,532,573 B1
(45) Date of Patent: Mar. 11, 2003

(54) LSI VERIFICATION METHOD, LSI VERIFICATION APPARATUS, AND RECORDING MEDIUM

(75) Inventor: Hitoshi Kurosaka, Tokyo (JP)

(73) Assignee: NEC Corporation, Tokyo (JP)

( * ) Notice: Subject to any disclaimer, the term of this patent is extended or adjusted under 35 U.S.C. 154(b) by 138 days.

(21) Appl. No.: 09/640,685

(22) Filed: Aug. 18, 2000

(30) Foreign Application Priority Data

Aug. 20, 1999 (JP) ............................................ 11-234228

(51) Int. Cl.$^7$ ................................................. G06F 9/45
(52) U.S. Cl. ................................ 716/5; 716/4; 716/18; 703/14; 703/25; 703/28; 714/738
(58) Field of Search .......................... 716/1–21; 703/13, 703/14, 15, 2, 21

(56) References Cited

U.S. PATENT DOCUMENTS 5,253,181 A * 10/1993 Marui et al. .................. 716/17
5,493,507 A * 2/1996 Shinde et al. ................. 703/14
5,812,431 A * 9/1998 Kundert ....................... 703/13
5,870,585 A * 2/1999 Stapleton ..................... 703/15
6,175,946 B1 * 1/2001 Ly et al. ....................... 703/14

FOREIGN PATENT DOCUMENTS

JP          8-287134          11/1996

* cited by examiner

Primary Examiner—Vuthe Siek
Assistant Examiner—Nghia M Doan
(74) Attorney, Agent, or Firm—Foley & Lardner

(57) ABSTRACT

The present invention is used to verify an equivalence between a software for realizing a predetermined function and a hardware data created according to the software and constituting a hardware operating identically as a processing by the software. The LSI verification method of the present invention simulates each of the hardware data and the software and compares, according to a signal I/O condition defining operation of the hardware, an I/O signal state as a simulation result by the hardware data to a software variable as a simulation result of the software for verification of the equivalent.

24 Claims, 9 Drawing Sheets

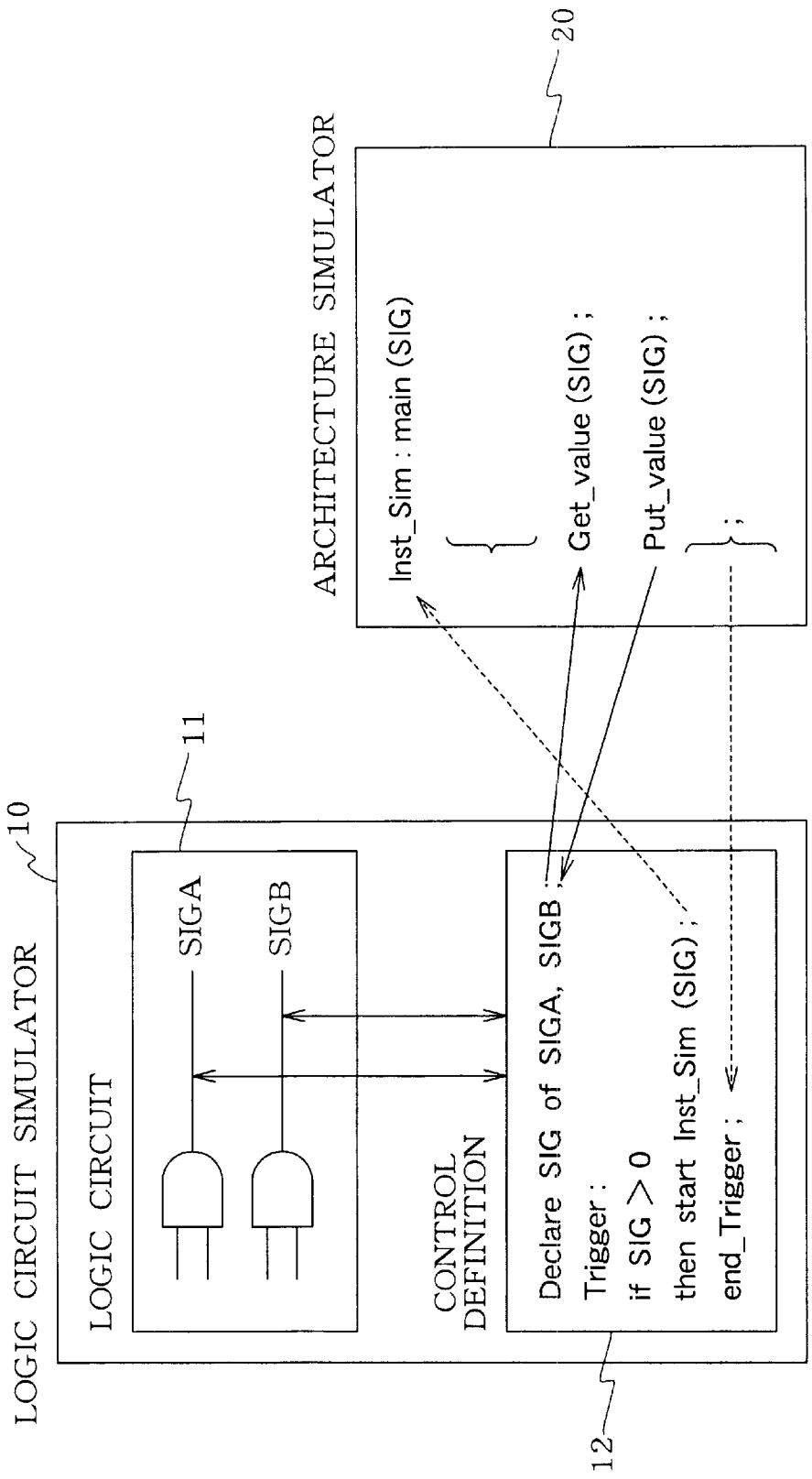

LSI VERIFICATION METHOD, LSI VERIFICATION APPARATUS, AND RECORDING MEDIUM

BACKGROUND OF THE INVENTION

1. Field of the Invention

The present invention relates to an LSI verification method and an LSI verification apparatus for verifying a design result of a system-on-chip LSI realizing system functions in hardware and software.

2. Description of the Related Art

A system-on-chip LSI is known in which an entire system specification is divided into a software portion, i.e., a function realized by processing according to a program by a processor in the LSI and a hardware portion, i.e., a function realized by hardware. The software portion and the hardware portion are provided in a one-chip LSI.

In design verification of a system-on-chip LSI, it is necessary to verify equivalence of an entire system specification with a system-on-chip LSI design data, to verify equivalence of a hardware portion with a specification, and to verify matching between the software portion and the hardware portion.

Moreover, in designing a system-on-chip LSI, there is a technique to create a software for generating all the system functions and then the software is divided and converted into a software portion and a hardware portion. The conversion into the hardware portion may be automatically performed by a tool or partially performed manually. This technique is effective for developing a system-on-chip LSI but there is a problem that the automatic conversion of a software operating sequentially into a hardware may fail in realizing a hardware operation intended or conversion mistake may be involved due to the manual operation. Accordingly, verification is indispensable.

For verification of the equivalence, an expected value for an input test pattern is defined in advance according to a design specification, so that a state of an output signal of a simulation result is compared to the expected value.

As such a verification method, for example, Japanese Patent Publication 8-287134 discloses a verification method using a logic circuit performing verification of matching between a software and a hardware.

FIG. 11 shows an outline of a conventional verification method.

In FIG. 11, an architecture simulator 20 has a function for simulating a software portion described in an architecture level. A logic circuit simulator 10 has a function for simulating a hardware portion described in a gate level and additionally contains a control definition 12 defining an execution condition of an architecture simulation as a result of a hardware simulation. In a conventional logic circuit verification method, simulation of the logic circuit is performed according to an input condition and if the logic circuit simulation result satisfies the execution condition of the architecture simulation, the architecture simulation is performed, so that the logic circuit simulation result and the architecture simulation result are compared to the design specification for verification.

In the aforementioned conventional LSI verification method, it is necessary to define an expected value in advance, which complicates the verification. Moreover, since verification is performed by using the logic circuit simulator of the gate level and the architecture simulator of the architecture level, it is impossible to perform verification on a design level other than the gate level and the architecture level. For example, in development of a large-scale LSI, bugs are eliminated as may as possible in the intermediate design phase before proceeding to a next phase, so as to minimize the total development period. However, in the conventional example, verification cannot be performed in an intermediate phase.

Moreover, the conventional example has a problem that verification cannot be performed at a stage when a level other than the gate level and the architecture level is involved. For example, a concurrent design is carried out in development of a large-scale LSI. The design levels are not always matched with one another and there is a possibility that a plurality of design levels are present. In such a state, verification cannot be performed by the conventional example. Furthermore, the logic circuit simulator and the architecture simulator should be interlocked via a control definition. This requires a dedicated logic circuit simulator and a dedicated architecture simulator. Various companies provide various LSI simulator tools. When a user can use a simulation tool the user is accustomed to use or can use a simulation tool of optimal performance available, that is beneficial. However, it is a demerit that a user should select a dedicated simulator.

Moreover, the conventional example has a problem that in order to verify a logic circuit, it is necessary to describe the other portion than the logic circuit at the architecture level and to set a control definition required for this. That is, a work efficiency is low.

SUMMARY OF THE INVENTION

It is therefore an object of the present invention to provide an LSI verification method and apparatus appropriate for verification of a system-on-chip LSI.

In order to achieve the aforementioned object, the LSI verification method according to the present invention is for verifying an equivalence between a software for realizing a predetermined function and a hardware data created according to the software so as to constitute a hardware operating identically as a processing by the software, and comprises steps of: simulating each of the hardware data and the software, and comparing a result of simulation by the hardware to a result of simulation by the software.

The LSI verification apparatus according to the present invention is for verifying an equivalence between a software for realizing a predetermined function and a hardware data created according to the software so as to constitute a hardware operating identically as a processing by the software, and comprises:

a recording device for temporarily holding a simulation result; and a processor for verifying an equivalence by comparing a result of simulation by the hardware data to a result of simulation by the software.

The recording medium according to the present invention contains a program causing a computer to perform verification of an equivalence between a software for realizing a predetermined function and a hardware data created according to the software so as to constitute a hardware operating identically as a processing by the software, wherein a simulation result is held in a recording device and a result of simulation by the hardware data is compared to a result of simulation by the software for the verification.

Thus, an equivalence between a software and a hardware data operating identically as the software can be verified through comparison of a simulation result of the software with a simulation result of the hardware. Accordingly, there is no need of defining an expected value in advance, which simplifies the verification work.

It should be noted that it is also possible, according to a signal I/O condition defining operation of the hardware, to compare a state of an output signal as a simulation result of the hardware data to a software variable as a simulation result of the software.

As an LSI verification apparatus in this case, the recording device stores an I/O condition of a signal defining operation of the hardware, and the processor compares, according the I/O condition, an output signal state as a simulation result by the hardware data to a software variable as a simulation result by the software.

Moreover, in this case, the recording medium contains a program causing a computer to hold the signal I/O condition defining the hardware operation and to compare, according to the I/O condition, an output signal state as a simulation result by the hardware data to a software variable as a simulation result by the software.

Accordingly, the equivalence between a software and a hardware operating identically as the software but having a different operation speed can be verified by comparing a software I/O variable to a corresponding hardware I/O signal. This simplifies the verification work.

Moreover, it is also possible to complete a simulation of the software and then perform a simulation by the hardware while performing the comparison.

In this case, in the LSI verification apparatus, the processor completes a simulation by the software and then performs a simulation by the hardware data while performing the comparison.

In this case, the recording medium contains a program causing a computer to complete a simulation by the software and the perform a simulation by the hardware data while performing the comparison.

Accordingly, it is possible to verify the equivalence while paying attention to the hardware and to easily determine a moment when an NG condition (no good, unacceptable) is caused by the hardware, thus simplifying the verification work.

Furthermore, it is also possible to complete a simulation by the hardware data and then perform a simulation of the software while performing the comparison.

In this case, in the LSI verification apparatus, the processor completes a simulation by the hardware and then performs a simulation by the software while performing the comparison.

In this case, the recording medium contains a program causing a computer to complete a simulation by the hardware data and then perform a simulation by the software while performing the comparison.

Accordingly, it is possible to perform verification while paying attention to the software and to easily determine a moment when an NG condition (no good, unacceptable) is caused by the software processing, thus simplifying the verification work.

BRIEF DESCRIPTION OF THE DRAWINGS

FIG. 11 shows an outline of a conventional verification example.

DESCRIPTION OF THE PREFERRED EMBODIMENTS

Description will now be directed to an embodiment of the present invention with reference to the attached drawings.

Figure 1:
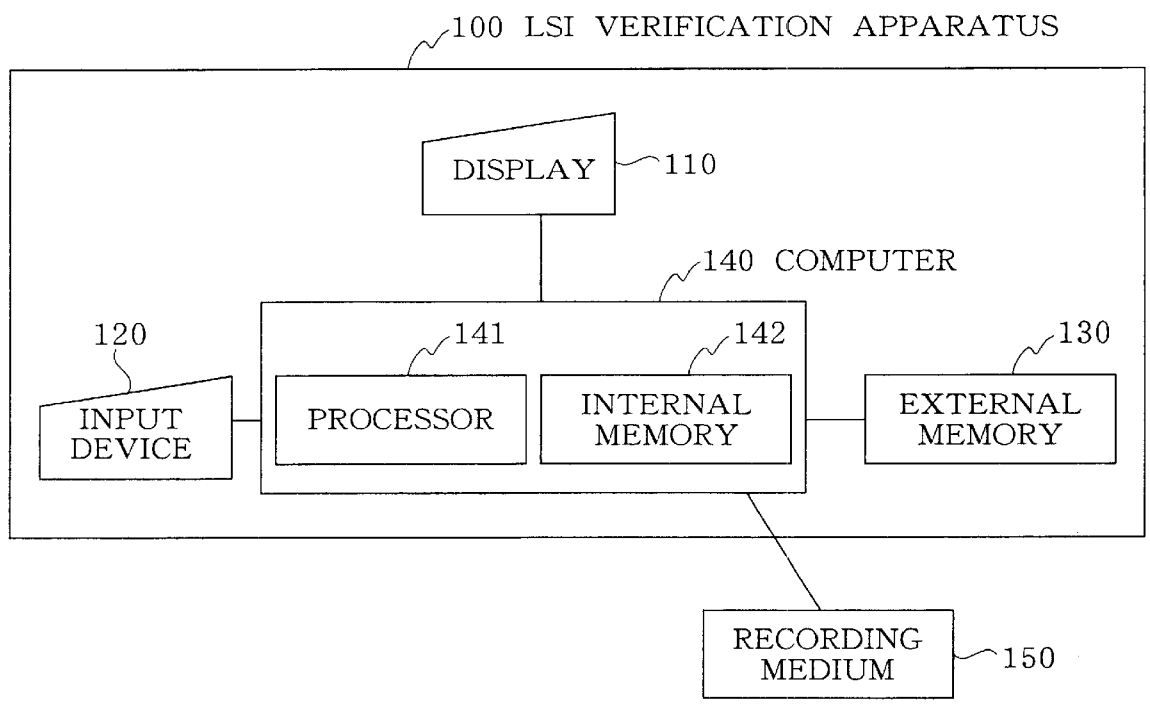
FIG. 1 is a block diagram showing a configuration of an LSI verification apparatus according to an embodiment of the present invention.

FIG. 1 is a block diagram showing a configuration of an LSI verification apparatus of the present embodiment.

Figure 2:
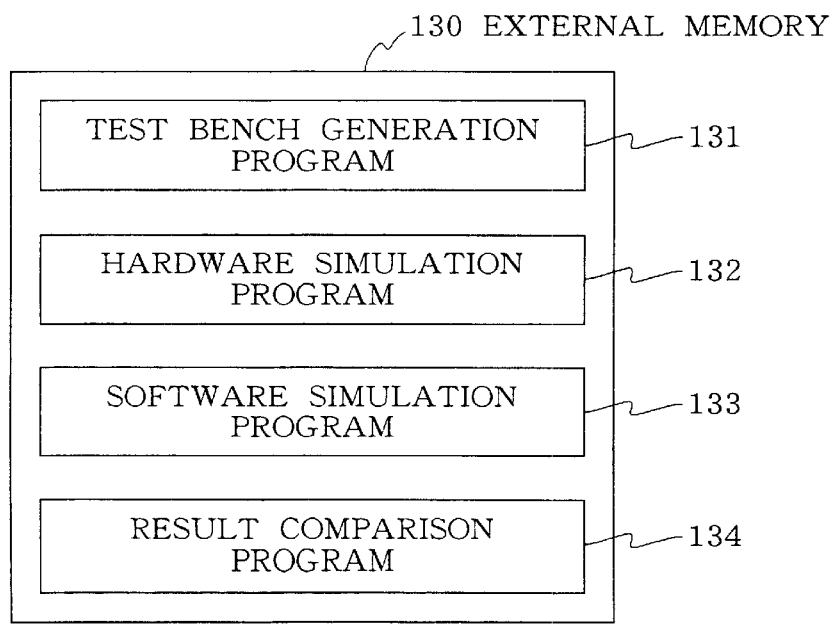
FIG. 2 is a table showing an example of recorded contents of an external memory 130 shown in FIG. 1.

FIG. 2 is a table showing an example of recorded contents of an external memory 130 shown in FIG. 1.

In FIG. 1, the LSI verification apparatus 100 includes: a display block 110 for displaying a result of the verification; an input device 120 for entering an input pattern of a hardware simulation and an initial condition of a software simulation; an external memory 130 for accumulating program files and data files; and a computer 140 for reading out a program from the external memory 130 and executing the program. The computer 140 includes: a processor 141 for reading out a program from the external memory 130 and executing a process according to the program read out; and an internal memory 142 which is a work area holding a program and a data for a process execution in the processor 141.

As shown in FIG. 2, the external memory 130 contains, for example, a test bench generation program 131 for generating a test bench according to a signal I/O condition (hereinafter, referred to as a timing information) and a circuit information; a hardware simulation program 132 for performing a hardware simulation according to a given input pattern and the test bench; a software simulation program 133 for performing a software simulation according to a given initial condition; a result comparison program 134 for comparing a hardware simulation result to a software simulation result. It should be noted that the hardware simulation program 132 and the software simulation program 133 may not be contained in the external memory 130. Moreover, the hardware simulation and the software simulation may be performed by an LSI verification apparatus or using another computer.

The processor 141 reads out a program recorded in the external memory 130 and performs a process described below, according to the program.

Figure 3:
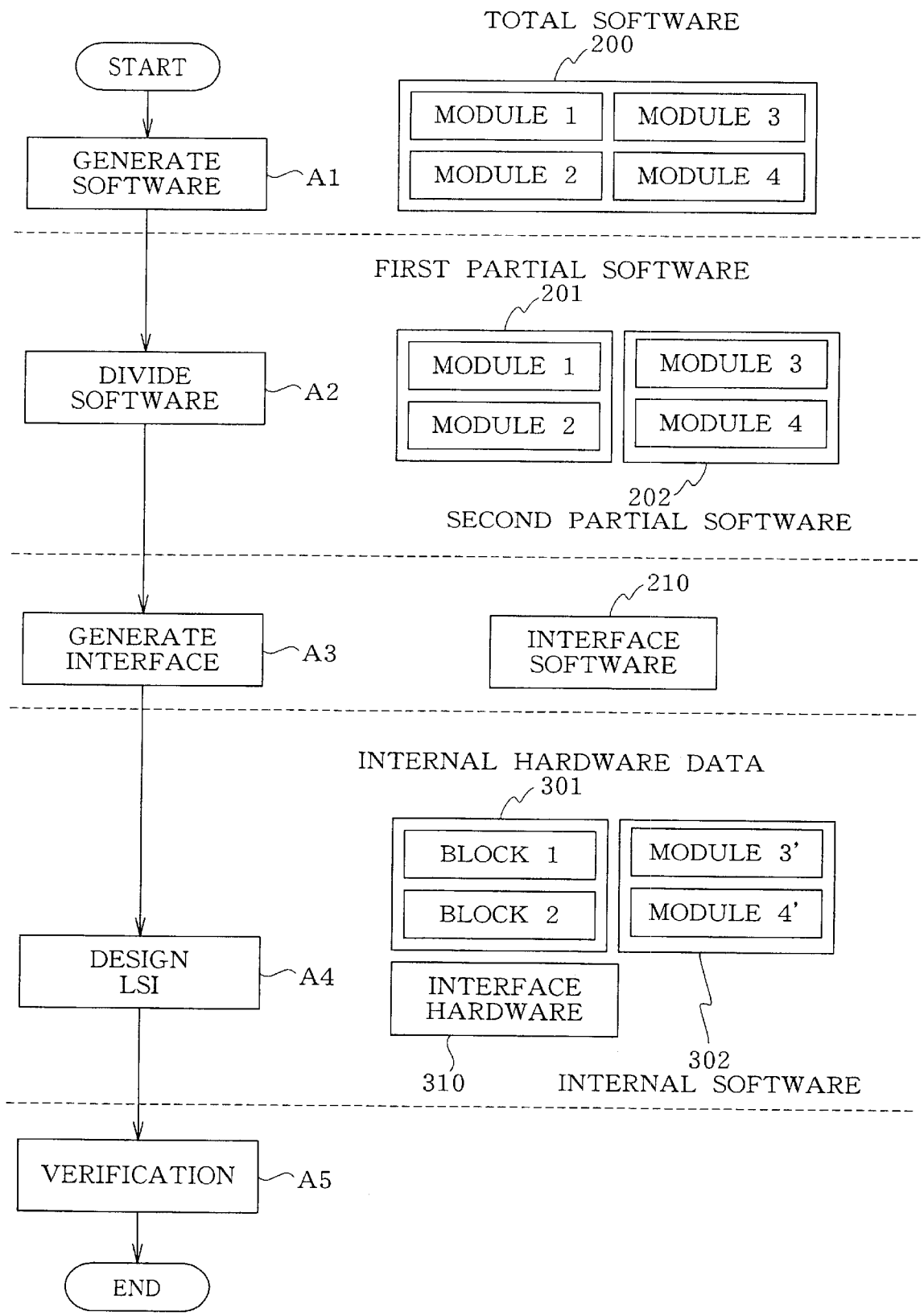
FIG. 3 is a flowchart showing an example of development process of a system-on-chip LSI.

FIG. 3 is a flowchart showing an example of a development process of a system-on-chip LSI.

Figure 4:
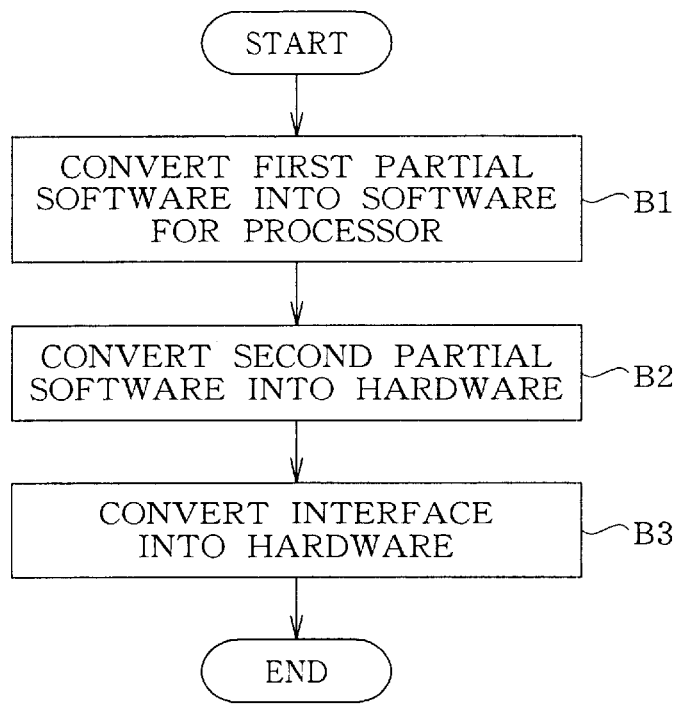
FIG. 4 is a flowchart showing a detailed process of the LSI design step shown in FIG. 3.

FIG. 4 is a flowchart showing a detailed process of the LSI design step shown in FIG. 3.

Figure 5:
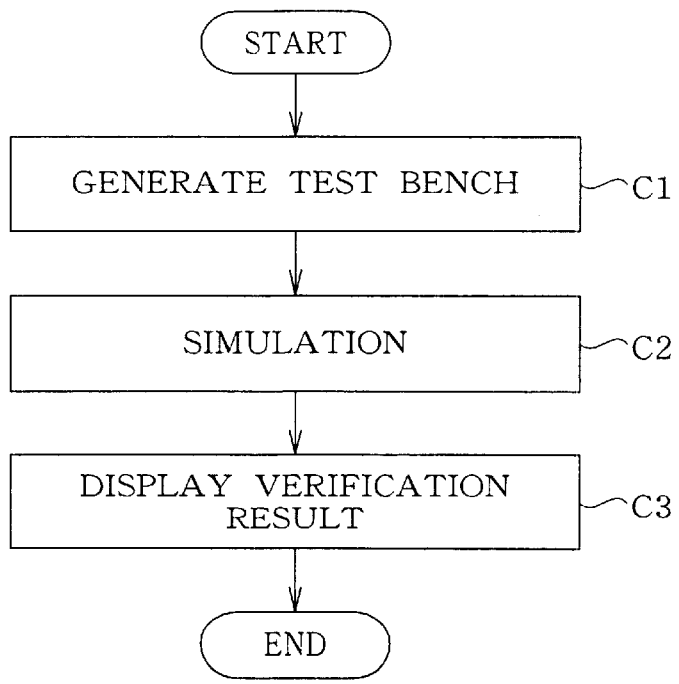
FIG. 5 is a flowchart showing a detailed process of the verification step shown in FIG. 3.

FIG. 5 is a flowchart showing a detailed process of the verification step shown in FIG. 3.

Figure 6:
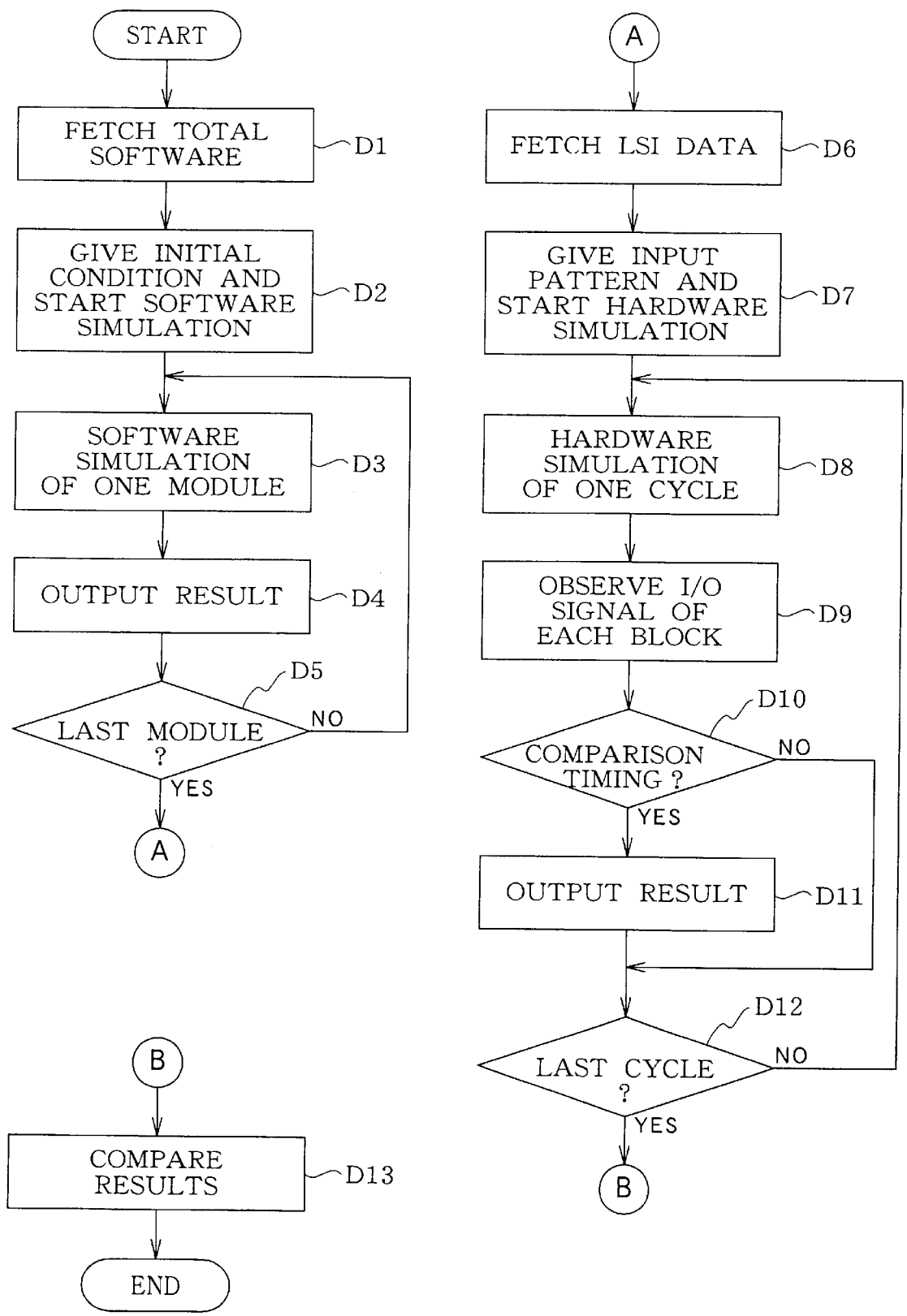
FIG. 6 is a flowchart showing a detailed process of the simulation step shown in FIG. 5.

FIG. 6 is a flowchart showing a detailed process of the simulation step shown in FIG. 5.

In FIG. 3, firstly, a designer of the system-on-chip LSI creates a software for realizing a system design specification (hereinafter, referred to as a total software 200) and records it in the external memory 130 (step A1). Here, the total software 200 is created as a set of software in which a predetermined function called a module is implemented. Next, the designer divides the total software 200 on module basis into a portion (hereinafter, referred to as a first partial software 201) to be realized by hardware and a portion (hereinafter, referred to as a second partial software 202) to be realized by software and records them in the external memory 130 (step A2). Subsequently, the designer creates an interface software 210 as an interface portion of the first partial software 201 and the second partial software 202 and records it in the external memory 130 (step A3). The processor 141 is operated by the designer to read out the first partial software 201, the second partial software 202, and the interface software 210, convert them into a data that can be built in an LSI, and record the converted data in the external memory 130 (step A4). Here, the modules converted into hardware function units are called blocks. Lastly, the designer performs verification by simulation (step A5).

Next, detailed explanation will be given on the LSI design step shown in step A4 of FIG. 3 with reference to FIG. 4.

In FIG. 4, firstly, the processor 141 reads out the second partial software 202 from the external memory 130, converts it into a software (hereinafter, referred to as an internal software 302) to be operated in the processor 141 on the LSI, and record the internal software 302 in the external memory 130 (step B1). Next, the processor 141 reads out the first partial software 201 from the external memory 130 and convert it by logical synthesis or partially manually into a hardware description data (hereinafter, referred to as an internal hardware data 301). Here, I/O condition of respective signals, variables of software before conversion corresponding to the signals, circuit information, and the like are generated. The information generated is recorded in the external memory 130 (step B2). Next, the processor 141 reads out the interface software 210 from the external memory 130, converts it into hardware, and generates an interface hardware data 310. The interface hardware data 310 is recorded in the external memory 130 (step B3). It should be noted that the sequence of the steps B1 to B3 may be changed.

Next, a detailed explanation will be given on the verification step as step A5 shown in FIG. 3 with reference to FIG. 5.

In FIG. 5, firstly, the processor 141 executes the test bench generation program 131 to generate a test bench according to the timing information and the circuit information which have been read out from the external memory 130 (step C1). The test bench generated here simulates a circuit operation according to the input pattern and outputs as a simulation result an I/O signal which is matched with a comparison timing condition selected from the timing information. Next, the processor 141 executes a hardware simulation of a hardware to be verified and a software simulation of the corresponding software, and compares the simulation results for verifying the equivalence (step C2). Subsequently, the processor 141 displays the verification result on the display apparatus 110 (step C3).

The aforementioned simulation step (step C2) will be detailed with reference to FIG. 6.

In FIG. 6, firstly, the processor 141 reads out the total software 200 from the external memory 130 (step D1). Next, the processor 141 starts a software simulation with an initial condition given via the input apparatus 120 or an initial condition give from a file contained in the external memory 130 (step D2). Subsequently, the processor 141 executes a software simulation about a module (step D3) and records the software simulation result in the external memory 130 (step D4). Steps D3 to D5 are repeated until the software simulation of the last module is complete (step D5). When the software simulation of the last module is complete, the software simulation is complete.

Next, the processor 141 reads out the internal hardware data 301, the interface hardware data 310, and the internal software 302 from the external memory 130 (step D6) and starts a hardware simulation with a given input pattern (step D7). Subsequently, the processor 141 executes one cycle of hardware simulation as a sequence of operations by a single input pattern (step D8). Here, the processor 141 executes a simulation of an interlocked operation between the internal hardware data 301 and the internal software 302 if necessary. Next, the processor 141 observes an output signal on simulation of the respective blocks (step D9). Subsequently, the processor 141 determines whether the output signal satisfies the comparison condition (step D10). If so, the processor 141 outputs the observation result to the file of the external memory (step D11). Otherwise, the observation result is not output. Next, the processor 141 determines whether the cycle is the last. Unless the cycle is the last, the processor 141 executes a simulation with a next input pattern. If the cycle is the last, the hardware simulation is complete (step D12). Lastly, the processor 141 executes a result comparison program to compare the software simulation result with the hardware simulation result (step D13).

Here, by comparing the hardware simulation result when the internal hardware data 301 is interlocked with the internal software 302 to the software simulation result of the total software 200 through comparison items based on the timing information of the internal hardware 301, it is possible to verify the equivalence between the first partial software 201 containing a software description and the internal hardware data 301. Accordingly, there is no need of defining an expected value. Thus, the verification is simplified, enabling to provide a verification method of an LSI having a short period of time for development. Moreover, since the hardware description level is not limited, it is possible to perform verification on an algorithm level, an architecture level, a register transfer level and a gate level. Moreover, since a mixture can also be handled, it is possible to verify a system-on-chip effectively, enabling to reduce the period of time for development.

Furthermore, since the hardware simulation program 132 does not need a special processing, it is possible to use a general-purpose simulation tool and by selecting an optimal simulation tool, it is possible to reduce the period of time for development.

It should be noted that the LSI verification method of the present invention can also be used for verification of only the internal hardware data 301. In this case, in step D6, only the internal hardware data 301 is read out and in step D1, only the second partial software 202 need to be read out. Moreover, the interlocking between the internal hardware data 301 and the internal software 302 at step D8 is not performed.

Accordingly, the equivalence can be verified by comparing the hardware simulation result with the software simulation result of the first partial software 201 according to comparison items based on the timing information of the internal hardware data 301. There is no need of defining an expected value in advance, and the verification process is simplified, which in turn reduces the period of time for development. Moreover, conversion into hardware does not limit the description level and accordingly, it is possible to verify the internal hardware data 301 with a high efficiency, reducing the period of time for development.

Moreover, the verification method according to the present invention can also verify an LSI in which an entire portion is realized by hardware. In this case, the total software 200 is entirely converted into hardware, so that a result of a software simulation of the total software can be compared to a result of a hardware simulation.

Thus, the equivalence can be verified by comparing the hardware simulation result with the software simulation result. Accordingly, there is no need of defining an expected value in advance, which simplifies the verification and reduce the time required for development. Moreover, the conversion into hardware does not limit the description level, which enables to verify an LSI with a high efficiency and reduce the time required for development.

Figure 7:
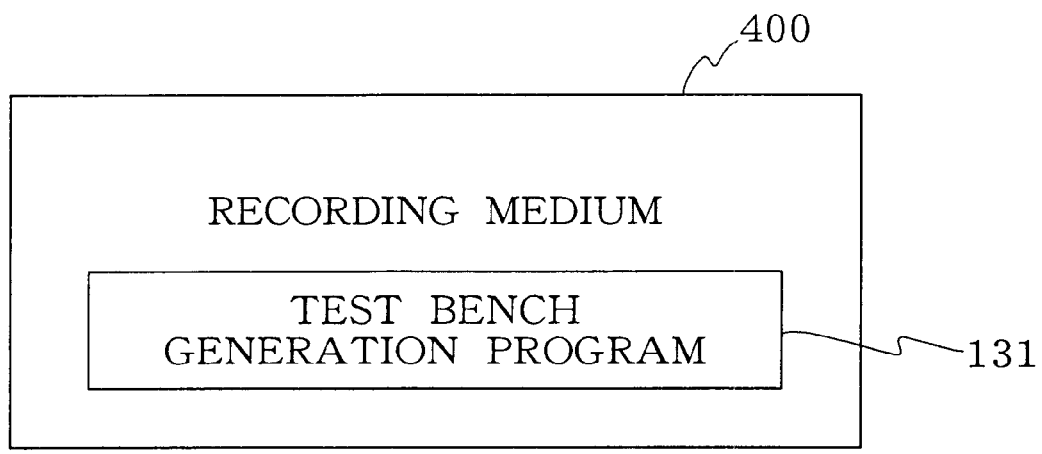
FIG. 7 shows a recording medium 400 containing a test bench generation program 131.

FIG. 7 shows a recording medium 400 having a test bench generation program 131.

As shown in FIG. 7, the test bench generation program 131 can be stored in the recording medium 400. In this case, the processor 141 can read out the test bench generation program 131 from the recording medium 400 and write it into the external memory 130 in advance. This recording medium 400 may be a magnetic disc, a semiconductor memory, or other recording medium.

Moreover, the processor 141 may perform a software simulation while comparing from time to time the results in the simulation step C2. In this case, the function of the result comparison program 133 is built in the software simulation program 133 and the external memory 130 does not need the result comparison program 134.

Figure 8:
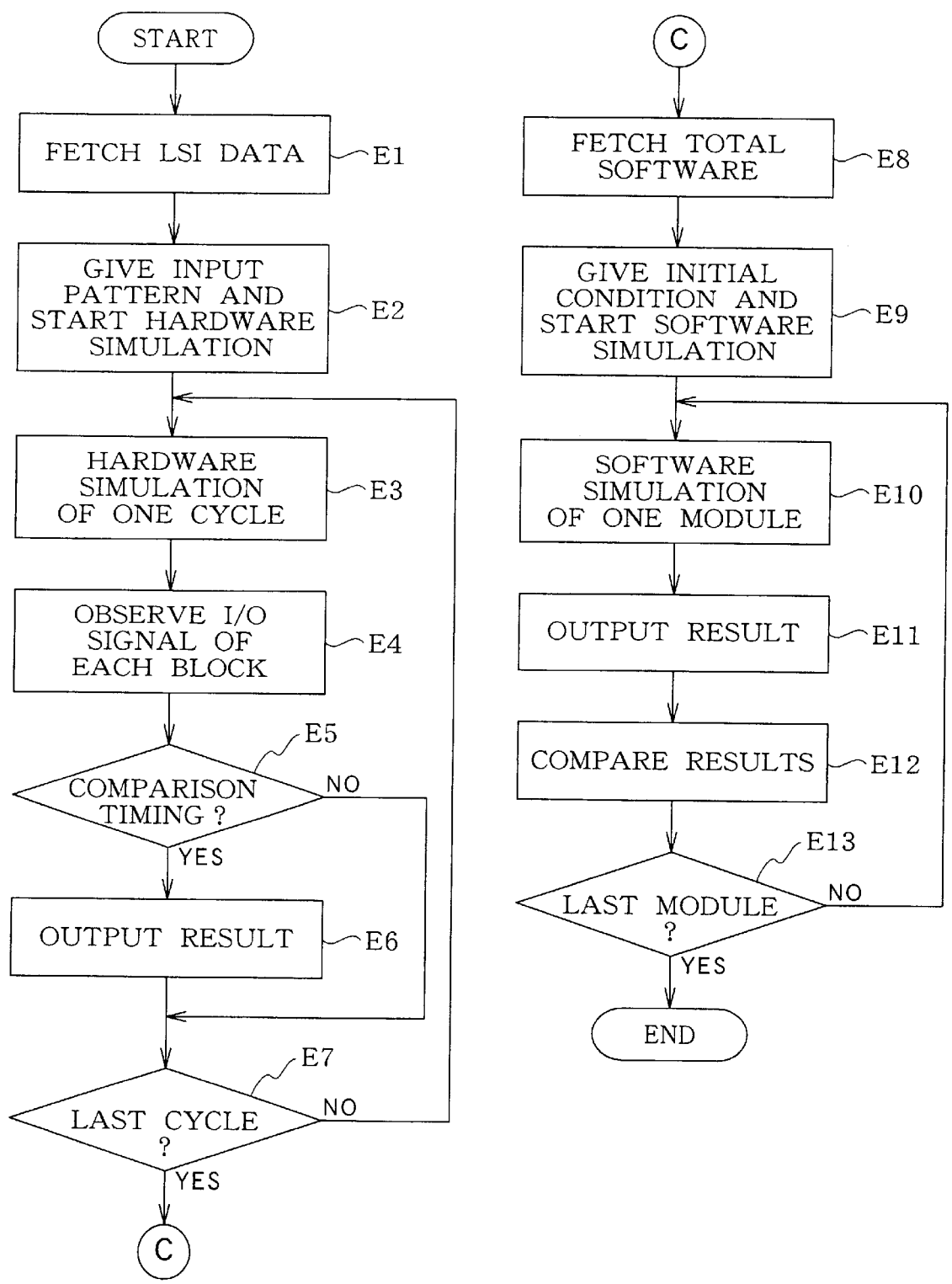
FIG. 8 is a flowchart showing a detailed process of the simulation step C2 when a software simulation is performed while comparing results.

FIG. 8 is a flowchart showing a detailed procedure of the simulation step C2 when a software simulation is performed while comparing results from time to time.

In FIG. 8, firstly, the processor 141 completes a hardware simulation of LSI data (steps E1 to E7) and then performs a software simulation (steps E8 to E13) while comparing results (step E12).

Thus, a comparison verification is performed while a software simulation is performed. Accordingly, it is possible to perform a verification while paying attention to the software. It is easy to identify a portion of software having a failure. This reduces the period of time required for debug of the system-on-chip LSI.

It should be noted that in this case also, it is possible to verify only the internal hardware data 301. In this case, step E1 needs to fetch only the internal hardware data 301 and step E8 needs to fetch only the second partial software 202. Moreover, no interlocking between the internal hardware data 301 and the internal software 302 in step E3 is required.

Moreover, the test bench generation step C1 in FIG. 5 may generate a test bench having a function for performing a result comparison. In that case, in the simulation step C2, the processor 141 performs a hardware simulation while performing a result comparison from time to time.

Figure 9:
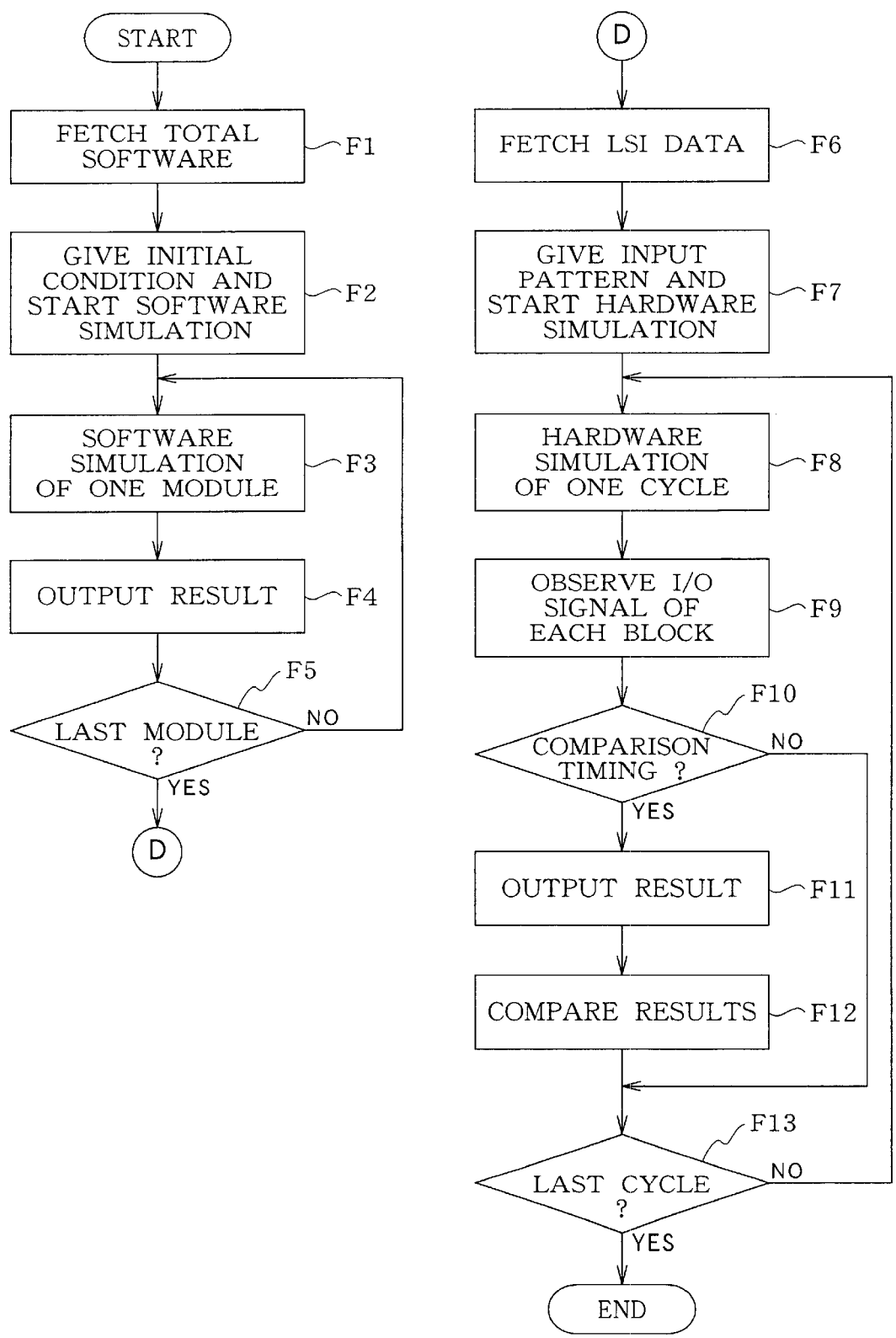
FIG. 9 is a flowchart showing a detailed process for performing a hardware simulation while comparing results at the simulation step (step C2).

FIG. 9 shows a flowchart showing a detailed procedure when a hardware simulation is performed while a result comparison is performed from time to time in the simulation step (step C2) of FIG. 5.

In FIG. 9, firstly, the processor 141 completes a software simulation of the total software 200 (steps F1 to F5) and then performs a hardware simulation (steps F6 to F13) while performing a result comparison (step F12).

Thus, a comparison verification is performed while performing a hardware simulation. Accordingly, it is possible to perform a verification while paying attention to hardware and it is easy to identify a portion of hardware having a failure, which in turn reduces the period of time required for debug of the system-on-chip LSI.

It should be noted that in this case also, it is possible to verify only the internal hardware data 301. In that case, step F6 needs to fetch only the internal hardware data 301 and step F1 needs to fetch only the second partial software 202. Moreover, no interlock is performed between the internal hardware data 301 and the internal software 302 in step F8.

Figure 10:
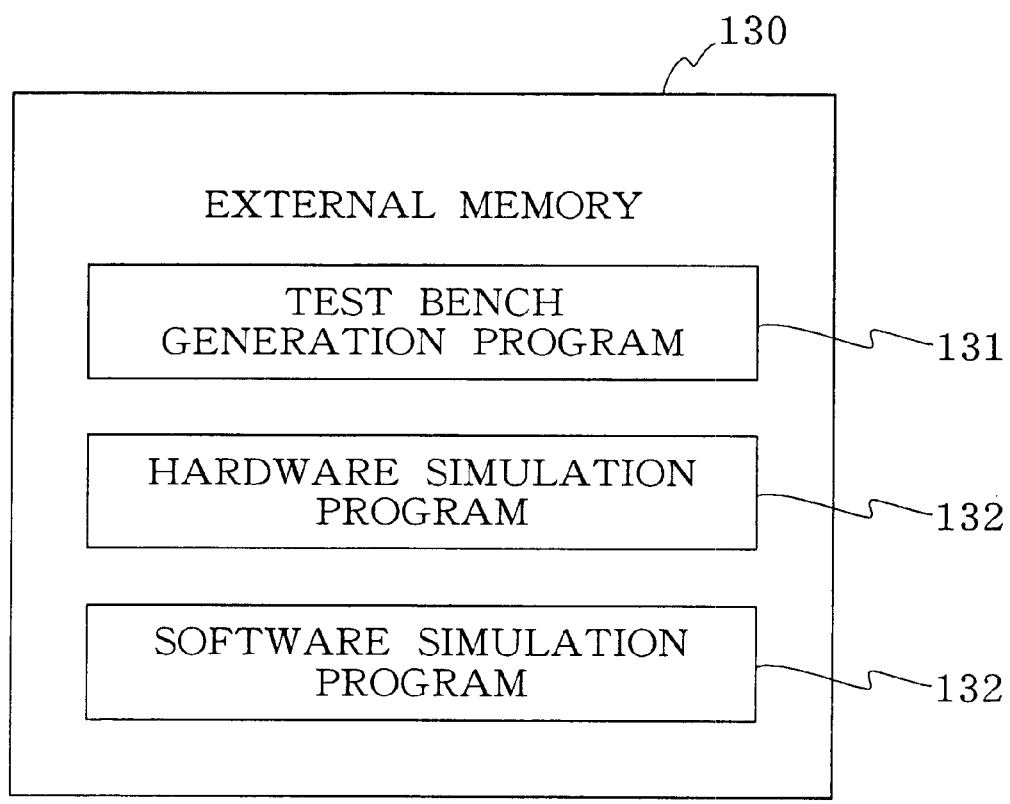
FIG. 10 is a table showing an example of recorded contents of the external memory 130 in FIG. 8 and FIG. 9.

FIG. 10 is a table showing an example of recorded contents in the external memory 130 in case of FIG. 8 and FIG. 9.

In FIG. 10, the function of result comparison is provided in the software simulation program 132 or the test bench and there is no result comparison program 134 unlike in FIG. 2.

As has been described above, the present invention has effects as follows.

A simulation result of software is compared to a simulation result of hardware operating in the same way as the software. This makes it unnecessary to define an expected value in advance to the hardware simulation, which simplifies the verification procedure and reduces the time required for development. Moreover, in developing a system-on-chip LSI, a simulation result of software realizing the entire system specification is compared to a simulation result of the LSI hardware data through interlock between a hardware data converted into the LSI and the software in the LSI. Thus it is possible to verify the equivalence as well as matching between the software and hardware within the LSI. This increases the development efficiency and reduces the time required for development.

It should be noted that when a comparison is performed according to a timing information which is the I/O condition of respective signals of hardware obtained by conversion into hardware, it is possible to verify the equivalence by a comparison between a software variable and a corresponding hardware I/O signal. Thus, it is possible to simplify the verification work and increase the development efficiency, reducing the time required for development.

Moreover, when a software simulation is completed and a hardware simulation is performed while comparing results, it is possible to perform verification while paying attention to hardware and to easily determine the moment when NG is caused by a hardware operation. This simplifies the verification work and increases the development efficiency, reducing the time required for development.

Furthermore, when a hardware simulation is completed and a software simulation is performed while comparing results, it is possible to perform verification while paying attention to software and to easily determine the moment when NG is caused by a software processing. This simplifies the verification word and increases the development efficiency, reducing the time required for development.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-234228 (Filed on Aug. 20, 1999) including specification, claims, drawings and summary are incorporated herein by reference in its entirety.

What is claimed is:

1. An LSI verification method for verifying an equivalence between a software for realizing a predetermined function and a hardware data created according to said software so as to constitute a hardware operating identically as a processing by said software, said method comprising steps of:

simulating each of said hardware data and said software, and comparing a result of simulation of said hardware data to a result of simulation of said software; and wherein said hardware data comprises hardware description data and an internal software portion which are derived from said software.

2. An LSI verification method as claimed in claim 1, wherein an I/O signal state resulting from the simulation of said hardware data is compared to a software variable resulting from the simulation of said software, and wherein said I/O signal state defines an operation of said hardware.

3. An LSI verification method as claimed in claim 1, wherein the simulation of said software is completed before said comparison and the simulation of said hardware data is performed while performing said comparison.

4. An LSI verification method as claimed in claim 2, wherein the simulation of said software is completed before said comparison and the simulation of said hardware data is performed while performing said comparison.

5. An LSI verification method as claimed in claim 1, wherein the simulation of said hardware data is completed before said comparison and the simulation of said software is performed while performing said comparison.

6. An LSI verification method as claimed in claim 2, wherein the simulation of said hardware data is completed before said comparison and the simulation of said software is performed while performing said comparison.

7. An LSI verification apparatus for verifying an equivalence between a software for realizing a predetermined function and a hardware data created according to said software so as to constitute a hardware operating identically as a processing by said software, said apparatus comprising:

a recording device for temporarily holding a simulation result;

a processor that simulates said hardware data and said software and that verifies said equivalence by comparing a result of the simulation of said hardware data to a result of the simulation of said software; and wherein said hardware data comprises hardware description data and an internal software portion which are derived from said software.

8. An LSI verification apparatus as claimed in claim 7, wherein said recording device stores a signal I/O condition defining an operation of said hardware, and said processor compares an I/O signal state which is the result of the simulation of said hardware data to a software variable which is the result of the simulation of said software.

9. An LSI verification apparatus as claimed in claim 7, wherein said processor completes the simulation of said software before said comparison and performs the simulation of said hardware data while performing said comparison.

10. An LSI verification apparatus as claimed in claim 8, wherein said processor completes the simulation of said software before said comparison and performs the simulation of said hardware data while performing said comparison.

11. An LSI verification apparatus as claimed in claim 7, wherein said processor completes the simulation of said hardware data before said comparison and performs the simulation of said software while performing said comparison.

12. An LSI verification apparatus as claimed in claim 8, wherein said processor completes the simulation of said hardware data before said comparison and performs the simulation of said software while performing said comparison.

13. A recording medium containing a program causing a computer to perform a verification of an equivalence between a software for realizing a predetermined function and a hardware data created according to said software so as to constitute a hardware operating identically as a processing by said software, wherein a simulation of said hardware data is performed and a simulation of said software is performed, results of said simulations are held in a recording device, said result of the simulation of said hardware data is compared to said result of the simulation of said software for said verification; and wherein said hardware data comprises hardware description data and an internal software portion which are derived from said software.

14. A recording medium as claimed in claim 13, said medium containing a program for causing a computer to store a signal I/O condition defining operation of said hardware, and to compare, according to said I/O condition, an I/O signal state which is the result of the simulation of said hardware data to a software variable which is the result of the simulation of said software.

15. A recording medium as claimed in claim 13, said medium containing a program for causing a computer to complete the simulation of said software before said comparison and to perform the simulation of said hardware data while performing said comparison.

16. A recording medium as claimed in claim 14, said medium containing a program for causing a computer to complete the simulation of said software before said comparison and to perform the simulation of said hardware data while performing said comparison.

17. A recording medium as claimed in claim 13, said medium containing a program causing a computer to complete the simulation of said hardware data before said comparison and to perform the simulation of said software while performing said comparison.

18. A recording medium as claimed in claim 14, said medium containing a program causing a computer to complete the simulation of said hardware data before said comparison and to perform the simulation of said software while performing said comparison.

19. An LSI verification method for verifying an equivalence between a software for realizing a predetermined function and a hardware data created according to said software so as to constitute a hardware operating identically as a processing by said software, said method comprising steps of:

simulating each of said hardware data and said software, comparing a result of simulation of said hardware to a result of simulation of said software, and wherein a simulation of said hardware data is completed before said comparison and a simulation of said software is performed while performing said comparison.

20. An LSI verification method for verifying an equivalence between a software for realizing a predetermined function and a hardware data created according to said software so as to constitute a hardware operating identically as a processing by said software, said method comprising steps of:

simulating each of said hardware data and said software, comparing a result of simulation of said hardware to a result of simulation of said software, and wherein according to a signal I/O condition defining operation of said hardware, an I/O signal state as a result of simulation of said hardware data is compared to a software variable as a simulation result of said software, and wherein a simulation of said hardware data is completed before said comparison and a simulation of said software is performed while performing said comparison.

21. An LSI verification apparatus for verifying an equivalence between a software for realizing a predetermined function and a hardware data created according to said software so as to constitute a hardware operating identically as a processing by said software, said apparatus comprising:

a recording device for temporarily holding a simulation result;

a processor for verifying an equivalence by comparing a result of simulation of said hardware data to a result of simulation of said software; and wherein said processor completes a simulation of said hardware data before said comparison and performs a simulation of said software while performing said comparison.

22. An LSI verification apparatus for verifying an equivalence between a software for realizing a predetermined function and a hardware data created according to said software so as to constitute a hardware operating identically as a processing by said software, said apparatus comprising:

a recording device for temporarily holding a simulation result;

a processor for verifying an equivalence by comparing a result of simulation of said hardware data to a result of simulation of said software; and wherein said recording device stores a signal I/O condition defining an operation of said hardware, and said processor, according to said I/O condition, compares an I/O signal state as a result of a simulation of said hardware data to a software variable as a simulation result of said software;

wherein said processor completes a simulation of said hardware data before said comparison and performs a simulation of said software while performing said comparison.

23. A recording medium containing a program causing a computer to perform verification of an equivalence between a software for realizing a predetermined function and a hardware data created according to said software so as to constitute a hardware operating identically as a processing by said software, wherein a simulation result is held in a recording device and a result of simulation of said hardware data is compared to a result of simulation of said software for said verification; and said medium further containing a program causing a computer to complete a simulation of said hardware data before said comparison and to perform a simulation of said software while performing said comparison.

24. A recording medium containing a program causing a computer to perform verification of an equivalence between a software for realizing a predetermined function and a hardware data created according to said software so as to constitute a hardware operating identically as a processing by said software, wherein a simulation result is held in a recording device and a result of simulation by said hardware data is compared to a result of simulation by said software for said verification; and wherein said medium further contains a program causing a computer to store a signal I/O condition defining an operation of said hardware, and to compare, according to said I/O condition, an I/O signal state as a result of simulation of said hardware data to a software variable as a simulation of said software; and wherein said simulation of said hardware data is completed before said comparison and the simulation of said software is performed while said comparison is performed.

* * * * *